(12) United States Patent
Goldblatt

(10) Patent No.: US 9,020,458 B2
(45) Date of Patent: Apr. 28, 2015

(54) MIXER WITH CHANNEL IMPEDANCE EQUALIZATION

(71) Applicant: QUALCOMM Incorporated, San Diego, CA (US)

(72) Inventor: Jeremy Mark Goldblatt, Encinitas, CA (US)

(73) Assignee: QUALCOMM Incorporated, San Diego, CA (US)

(*) Notice: Subject to any disclaimer, the term of this patent is extended or adjusted under 35 U.S.C. 154(b) by 29 days.

(21) Appl. No.: 13/901,320

(22) Filed: May 23, 2013

(65) Prior Publication Data

US 2014/0348218 A1    Nov. 27, 2014

(51) Int. Cl.
| | |
|---|---|
| H04B 1/28 | (2006.01) |
| H04L 25/03 | (2006.01) |
| H03D 7/14 | (2006.01) |
| H03D 7/16 | (2006.01) |
| H03D 7/18 | (2006.01) |

(52) U.S. Cl.
CPC ........ *H04L 25/03878* (2013.01); *H03D 7/1441* (2013.01); *H03D 7/1458* (2013.01); *H03D 7/1466* (2013.01); *H03D 7/165* (2013.01); *H03D 7/18* (2013.01); *H03D 2200/0088* (2013.01)

(58) Field of Classification Search
CPC .............. H04B 1/02; H04B 1/04; H03D 7/18; H03D 7/165
USPC .......... 455/91, 115.1, 127.1, 209, 248.1, 293, 455/315, 333, 341
See application file for complete search history.

(56) References Cited

U.S. PATENT DOCUMENTS

| | | | |
|---|---|---|---|
| 5,153,469 A | 10/1992 | Petted et al. | |
| 6,121,818 A | 9/2000 | Kim et al. | |
| 6,724,230 B2* | 4/2004 | Hirabayashi | 327/280 |
| 7,173,492 B2 | 2/2007 | Takahashi et al. | |
| 7,482,852 B1* | 1/2009 | Samavati | 327/359 |
| 7,679,448 B1 | 3/2010 | McAdam et al. | |
| 8,145,155 B2 | 3/2012 | Pullela et al. | |
| 8,378,732 B2* | 2/2013 | Kousai et al. | 327/355 |
| 8,532,602 B2* | 9/2013 | Pehlivanoglu | 455/333 |
| 2002/0176198 A1* | 11/2002 | Cyrusian et al. | 360/68 |
| 2010/0081408 A1 | 4/2010 | Mu et al. | |
| 2013/0088262 A1* | 4/2013 | Pun et al. | 327/65 |

FOREIGN PATENT DOCUMENTS

WO    2011002455 A1    1/2011

OTHER PUBLICATIONS

International Search Report and Written Opinion—PCT/US2014/037894—ISA/EPO—Aug. 26, 2014.

\* cited by examiner

*Primary Examiner* — Tuan Pham
(74) *Attorney, Agent, or Firm* — Toler Law Group, PC

(57) ABSTRACT

A passive mixer with channel impedance equalization is disclosed. In an exemplary embodiment, an apparatus includes replica devices configured to generate replica output signals and an error amplifier configured to generate bias signals based on the replica output signals. The bias signals are configured to equalize on-state channel impedances associated with a mixer.

22 Claims, 4 Drawing Sheets

MIXER WITH CHANNEL IMPEDANCE EQUALIZATION

BACKGROUND

1. Field

The present application relates generally to the operation and design of analog front ends, and more particularly, to the operation and design of mixers for use in analog front ends.

2. Background

Transmitters typically use mixers to up-convert baseband signals to radio frequencies (RF). Receivers typically use mixers to down-convert RF signals to baseband signals. One type of mixer is a passive mixer that utilizes MOS switching devices. In a single transistor NMOS passive mixer, the signal dependent channel on-resistance is a result of the amplitude of both the input and output voltages, which results in signal dependent gain. The same can be said for a single transistor PMOS passive mixer. In a two transistor mixer having both PMOS and NMOS devices, the simultaneous enablement of both devices results in less overall signal dependent channel on-resistance due to the parallel combination of the PMOS and NMOS switch resistances. However, less than optimum mixer operation can occur when the local oscillator (LO) amplitudes are not equal and opposite or the process dependent on-resistances differ between the NMOS and PMOS devices.

The limitation of the operational voltage for MOS passive mixers results in a device specific limit for what may be considered acceptable linear operation. As the device geometries shrink so does the benefit that this architecture can provide. Basically there are two dominant constraints to limiting linear performance. The first constraint is that the voltage dependent resistance (channel of the MOS device) sets the lower limit of the MOS on-resistance. The second constraint is the parasitic activation of the MOS switch device (i.e., the device turns on when the signal is large thus clamping the signal's voltage for the region in time where activation occurs).

Therefore, it would be desirable to have a way to equalize the channel on-resistance of a MOS mixer to operate within the constraints described above.

BRIEF DESCRIPTION OF THE DRAWINGS

The foregoing aspects described herein will become more readily apparent by reference to the following description when taken in conjunction with the accompanying drawings wherein.

DETAILED DESCRIPTION

The detailed description set forth below in connection with the appended drawings is intended as a description of exemplary embodiments of the invention and is not intended to represent the only embodiments in which the invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
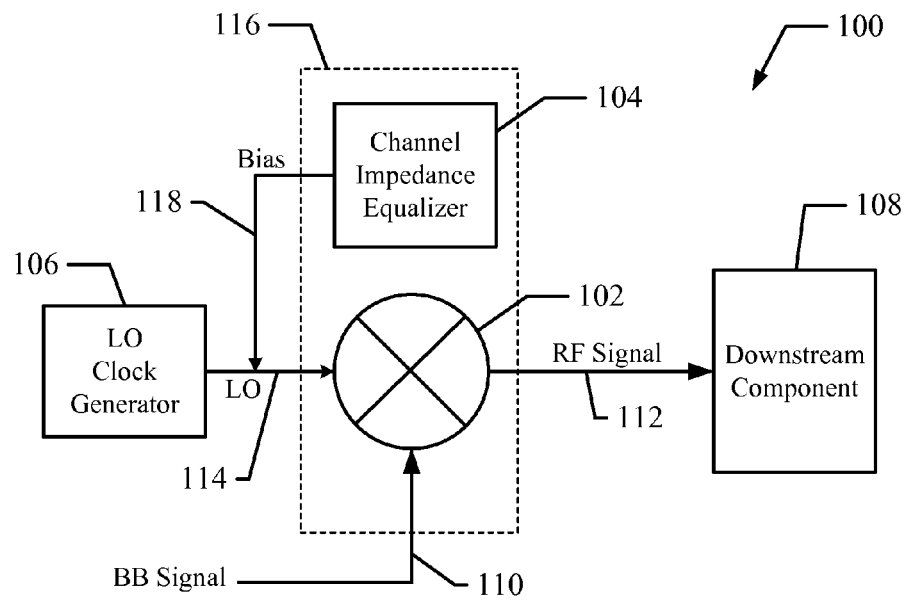
FIG. 1 shows a transmitter front end that comprises an exemplary embodiment of a channel impedance equalizer that is suitable for use in a wireless device.

FIG. 1 shows a transmitter front end 100 that comprises an exemplary embodiment of a channel impedance equalizer 104 that is suitable for use in a wireless device. The front end 100 comprises a MOS mixer 102, the channel impedance equalizer 104, LO clock generator 106, and downstream component 108. In an exemplary embodiment, the mixer 102 is comprised of metal oxide semiconductor (MOS) devices and operates to receive a baseband signal 110 from a baseband processor and up-converts this signal to an RF signal 112 using the LO signals 114. The RF output 112 is input to the downstream component 108 in the transmitter chain. For example, the downstream component 108 may be a driver amplifier, buffer, or other component used in the transmitter chain.

The channel impedance equalizer 104 is located on the same integrated circuit 116 as the mixer 102. The channel impedance equalizer 104 operates to generate bias signals 118 that bias the LO signals 114 so as to equalize the channel impedances of the MOS devices used in the mixer 102. For example, less than optimum mixer operation can occur when the LO signal amplitudes are not equal and opposite, and/or process dependent on-resistances differ between the NMOS and PMOS devices used in the mixer 102. In various exemplary embodiments, the channel impedance equalizer 104 operates to generate the bias signals 116 to reduce differences in LO amplitudes and equalize process dependent resistances of the MOS devices used in the mixer 102. Although shown with respect to a transmitter front end, the various embodiments disclose herein are equally applicable to a receiver front end. Thus, the channel impedance equalizer 104 can operate to generate bias signals to reduce differences in LO amplitudes and equalize process dependent resistances of the MOS devices used in a downconverting mixer as well as an upconverting mixer. A more detailed description of the channel impedance equalizer 104 and its operation is provided below.

Figure 2:
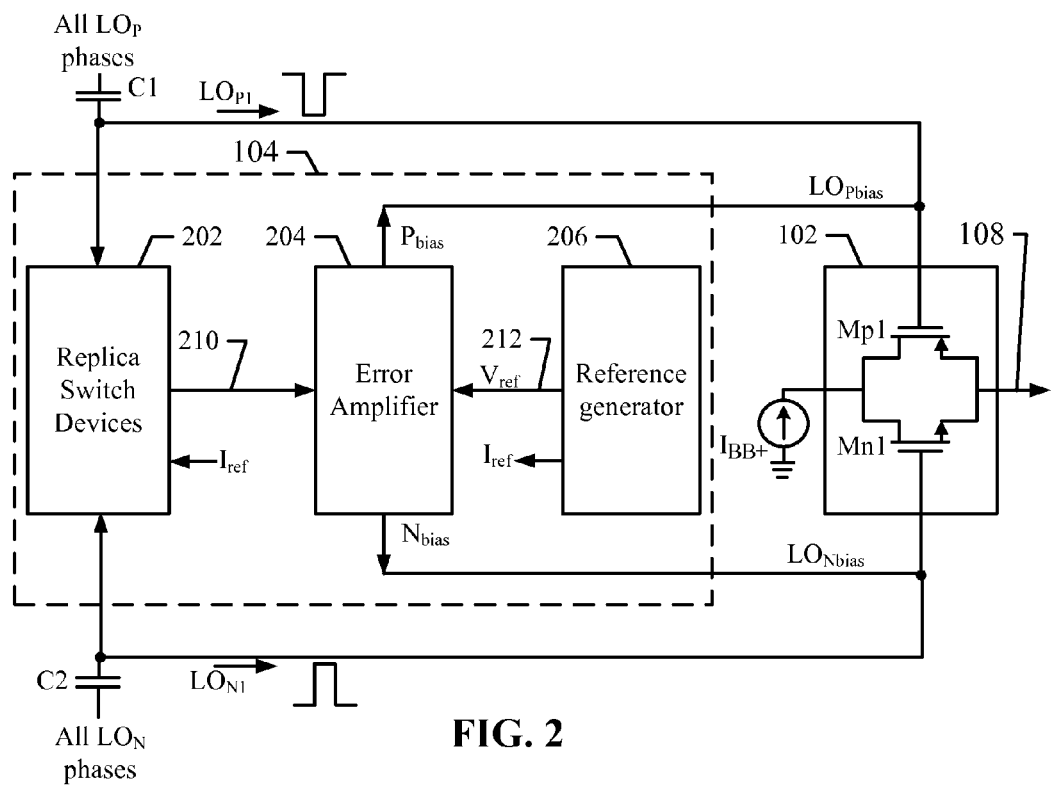
FIG. 2 shows an exemplary detailed embodiment of the channel impedance equalizer shown in FIG. 1.

FIG. 2 shows an exemplary detailed embodiment of the channel impedance equalizer 104 shown in FIG. 1. The channel impedance equalizer 104 comprises replica mixer switches 202, error amplifier 204, and a reference generator 206. The mixer 102 is also referred to herein as a "primary" mixer and comprises a plurality of PMOS/NMOS transistor pairs. For clarity only one PMOS/NMOS transistor pair ($M_{P1}$ and MO of the mixer 102 is shown. The devices ($M_{P1}$) and (MO are configured to receive LO signals ($LO_{P1}$ and $LO_{N1}$) at their gate terminals and up-convert a baseband signal ($I_{BB}$) to generate an up-converted signal 108.

In various exemplary embodiments, the channel impedance equalizer 104 and primary mixer 102 are configured with MOS switching device formed on the same integrated circuit. It should be noted that the various exemplary embodiments are not limited to the use of MOS switching devices. For example, the switching devices may comprise any switching devices having finite on-state channel impedance as a function of input voltage. For example, such devices include field effect transistor (FET) devices. Therefore, to simply the description, the various embodiments of the channel impedance equalizer 104 and primary mixer 102 are described herein as comprising MOS switching devices; however other switching devices, such as FET transistor devices, may also be used.

All phases of the LO signals pass through DC blocking capacitors C1 and C2 and are then provided to the replica mixer switches 202. The replica mixer switches 202 comprise NMOS and PMOS switches (or devices) that are located on the same integrated circuit as the switches of the primary mixer 102. Thus, any process variations that may occur during manufacture equally affect the switches of both the primary mixer 102 and replica mixer switches 202.

The replica mixer switches 202 receive all phases of the LO signals to activate the associated NMOS and PMOS switches where the on-resistance of each switch is measured by injecting a DC reference current ($T_{ref}$) through the switch and measuring the DC voltage of that switch. Since the switch is on only for ¼ of the LO period, the average voltage would be higher due to injecting the current into an open circuit. To mitigate the off switch voltage deviations a set of four replica mixer switches (shown in more detail in FIG. 3) are each activated with their respective clock phases. The four switches are connected in parallel and have their sources tied together and their drains tied together thus resulting in a continuous switch impedance. This configuration provides an estimate of the average switch on-resistance for the replica mixer switches 202 which scales up to the primary mixer's equivalent on-resistance. The measured voltage 210 is provided to the error amplifier 204.

The reference generator 206 generates a reference output 212 that is also input to the error amplifier 204. The reference output 212 is a voltage derived from one or more voltage references that is representative of an average channel on-resistance. The reference generator 206 also generates the DC reference current ($I_{ref}$) that is injected into the replica mixer switches 202.

The error amplifier 204 generates averaged P and N bias signals ($P_{bias}$ and $N_{bias}$) based on a comparison of the replica output 210 and the reference output 212. The averaged bias adjustments signals ($P_{bias}$ and $N_{bias}$) bias the LO signals ($LO_{P1}$ and $LO_{N1}$ in this case), which in turn equalize the channel on-resistance of the primary mixer's 102 PMOS and NMOS (Mp1 and Mn1) switches.

Therefore, various exemplary embodiments of the channel impedance equalizer 104 operate to provide precise process and LO amplitude tracking to improve the operation of the passive MOS mixer 102. The disclosed embodiments operate to perform at least the following functions.

1. Adjust the gate average DC offset voltage of a MOS mixer to equalize the on-resistances of PMOS and NMOS mixer switches.
2. Increase signal amplitude to distortion as a ratio, and to enable low voltage devices to be used as mixer switch devices, thereby resulting in power savings compared to other device options and facilitating the overall enablement of the passive mixer architecture.

Thus, in various exemplary embodiments, a complimentary MOS or CMOS passive mixer 102 is combined with a channel impedance equalizer 104. The complimentary nature of a mixer using an NMOS switch in parallel with a PMOS switch extends the range of linear operation by providing a more consistent combined channel resistance as a function of signal voltage. The channel impedance equalizer 104 goes further to equalize the channel impedances of the switches in real-time to overcome the inequalities associated with opposite but unequal LO amplitudes due to process and temperature, as well as process mismatches between the mixer's NMOS and the PMOS switches.

Figure 3:
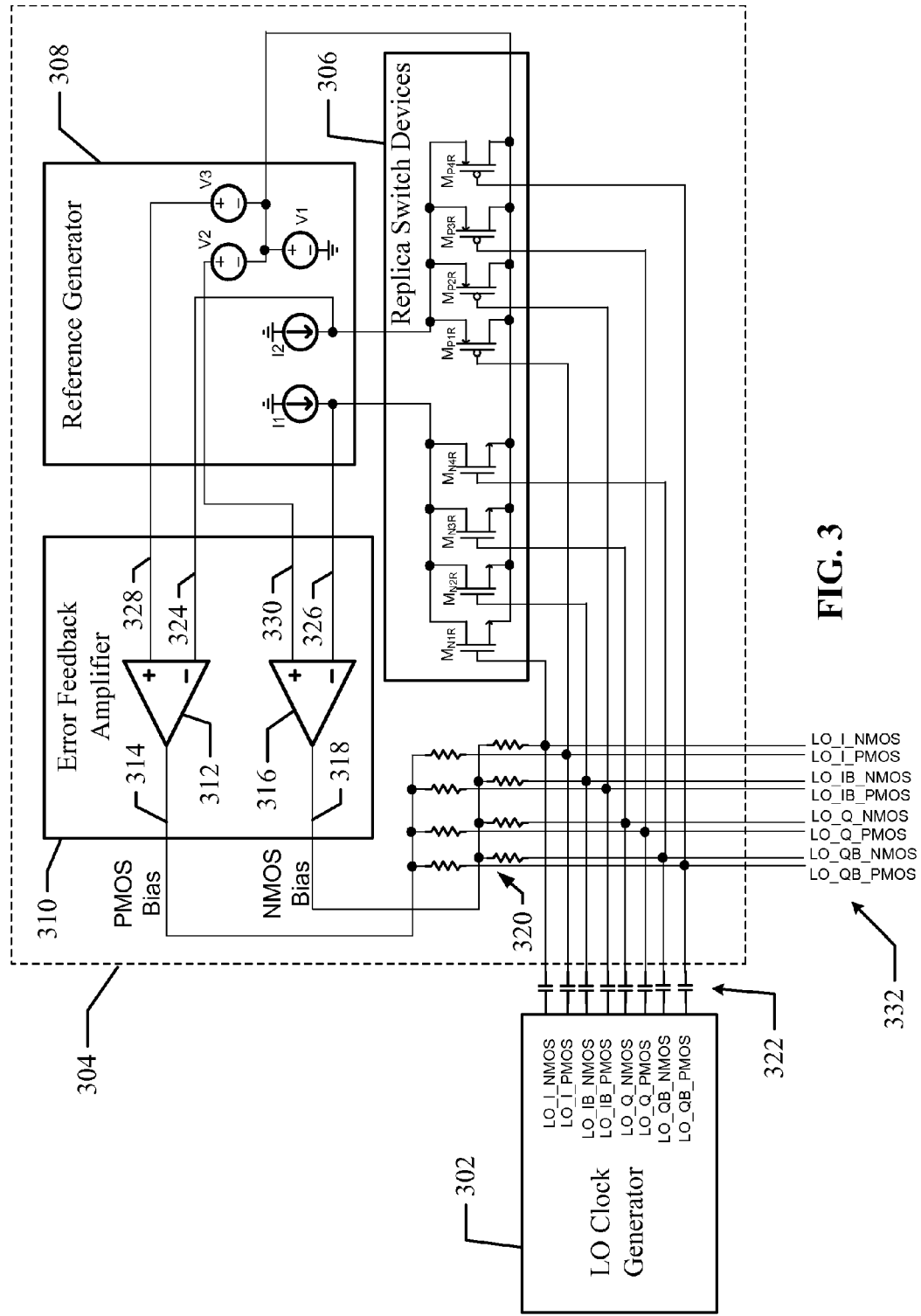
FIG. 3 shows an exemplary detailed embodiment of the channel impedance equalizer shown in FIG. 2.

FIG. 3 shows an exemplary detailed embodiment of a channel impedance equalizer 300. For example, the channel impedance equalizer 300 is suitable for use as the channel impedance equalizer 104 shown in FIG. 2. The channel impedance equalizer 300 comprises replica mixer switches 306, reference generator 308 and error feedback amplifiers 310. A detailed description of the construction and operation of the channel impedance equalizer 300 is provided below.

Replica Switch Devices

Figure 4:
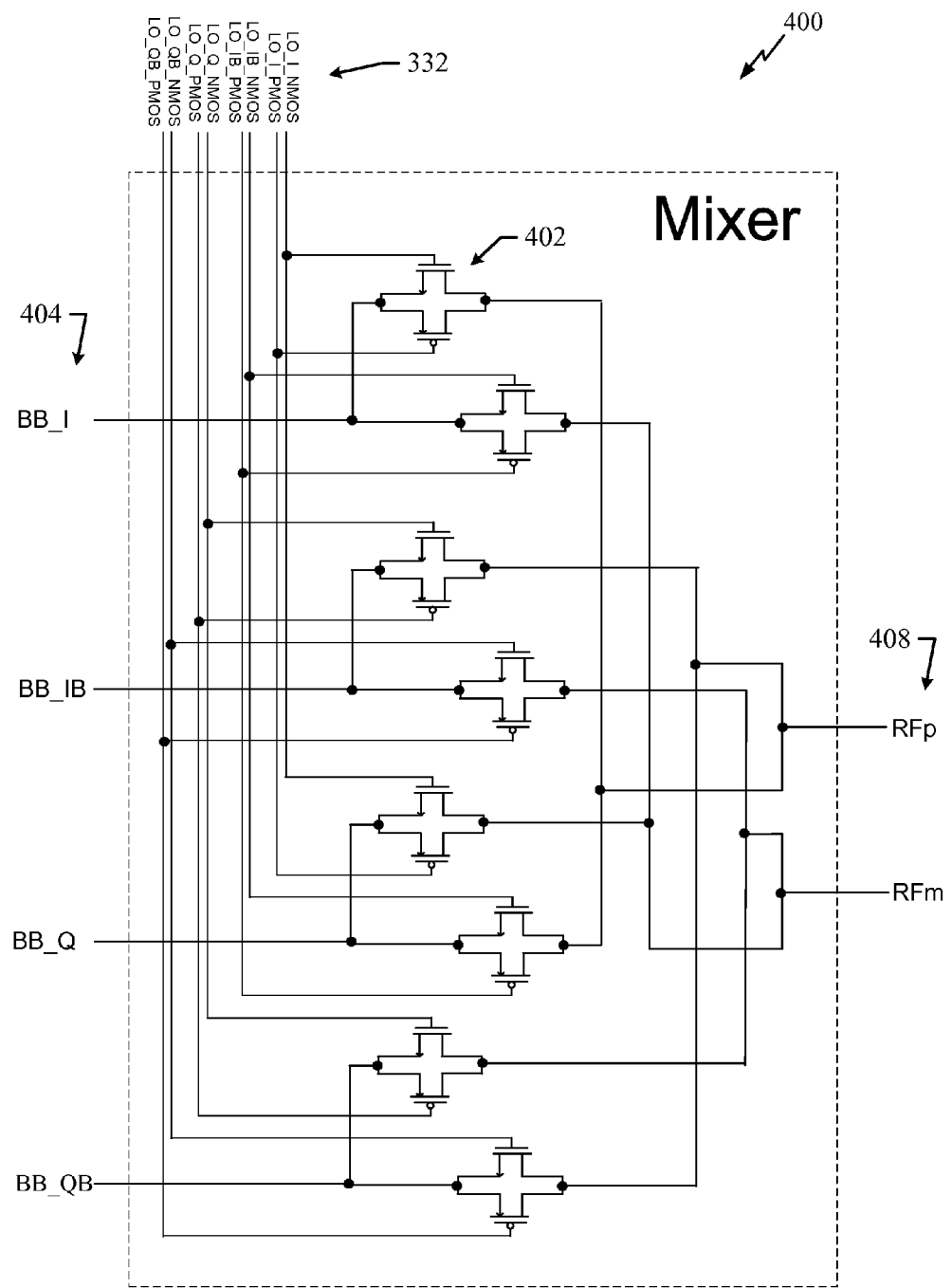
FIG. 4 shows an exemplary detailed embodiment of a mixer for use with the channel impedance equalizer shown in FIG. 3.

The replica switch devices 306 comprises devices $M_{P1R}$-$M_{P4R}$ and $M_{N1R}$-$M_{N4R}$ that are constructed on the same integrated circuit as a primary mixer, such as primary mixer 400 shown in FIG. 4, so that any process variations and/or temperature characteristics will be the same for all devices of both the replica switch devices 306 and the primary mixer 400. It should be noted that although eight replica switch devices are shown in FIG. 3, different numbers of replica switch devices can be utilized.

The gate terminals of $M_{P1R}$-$M_{P4R}$ and $M_{N1R}$-$M_{N4R}$ are connected through DC blocking capacitors 322 to receive corresponding LO signals generated by LO clock generator 302. The source terminals of $M_{P1R}$-$M_{P4R}$ are connected together and the source terminals of $M_{N1R}$-$M_{N4R}$ are connected together. The drain terminals of $M_{P1R}$-$M_{P4R}$ are connected together and the drain terminals of $M_{N1R}$-$M_{N4R}$ are connected together.

The source terminals of $M_{N1R}$-$M_{N4R}$ and the drain terminals of $M_{P1R}$-$M_{P4R}$ are further connected to a voltage reference (V1) provided by the reference generator 308. The drain terminals of $M_{N1R}$-$M_{N4R}$ and the source terminals of $M_{N1R}$-$M_{N4R}$ connected to current sources (IL 12), respectively, provided by the reference generator 308.

During operation, all phases of the LO signals activate corresponding switches of the replica switch devices 306 so that these switches approximate a constant resistance. For example, the switches $M_{P1R}$-$M_{P4R}$ approximate a first constant resistance and the switches $M_{N1R}$-$M_{N4R}$ approximate a second constant resistance. As disclosed below, these constant resistances in combination with first and second reference currents generate first 326 and second 324 replica output signals, respectively.

Reference Generator

In an exemplary embodiment, the reference generator 308 comprises the current sources I1, I2 and voltage sources V1, V2, V3. The voltage sources V2 and V3 are added to the voltage source V1 to generate first 330 and second 328 reference voltages, respectively. It should be noted that the reference generator 308 is not limited to the implementation shown in FIG. 3 and that other types of current and voltage generators may be used to generate the reference currents and voltages.

Error Feedback Amplifier

In an exemplary embodiment, the error feedback amplifier 310 comprises op-amps 312, 316, which operate to amplify the differences between a desired mixer channel impedance (determined from the voltage reference signals 328 and 330) and the measured replica-impedance (determined from the outputs 324 and 326 of the replica switch devices 306). The comparison results in a PMOS bias signal 314 and an NMOS bias signal 318 that are coupled to the LO signals through resistors 320 thus completing a feedback loop. The adjust LO signals are shown at 332.

The PMOS bias signal 314 and the NMOS bias signal 318 are applied to the LO signals, which are provided to a primary mixer, such as the mixer 400 shown in FIG. 4. These adjusted LO signals then serve to equalize the channel impedances of the switching devices of the primary mixer 400 to correct for process and/or LO amplitude variations.

FIG. 4 shows an exemplary detailed embodiment of a mixer 400. In an exemplary embodiment, the mixer 400 is configured as a passive mixer comprising MOS switching devices. For example, the mixer 400 is suitable for use as the mixer 102 shown in FIG. 1. The mixer 400 is configured to receive adjusted LO signals 332 from the channel impedance equalizer 300 shown in FIG. 3.

The mixer 400 comprises pairs of PMOS and NMOS switching pairs, such as illustrated at 402. In this exemplary embodiment there are eight PMOS/NMOS switch pairs. Each switch pair receives one of the baseband signals (shown at 404) that are to be up-converted to RF signals 408. Each of the eight PMOS/NMOS switch pairs also receives two of the adjusted LO signal phases 332. The adjusted LO signal phases have been adjusted with the NMOS bias and PMOS bias signals generated by the channel impedance equalizer 300 to equalize the channel impedances of the switching devices of the primary mixer 400 to compensate for process and/or LO amplitude variations.

Figure 5:
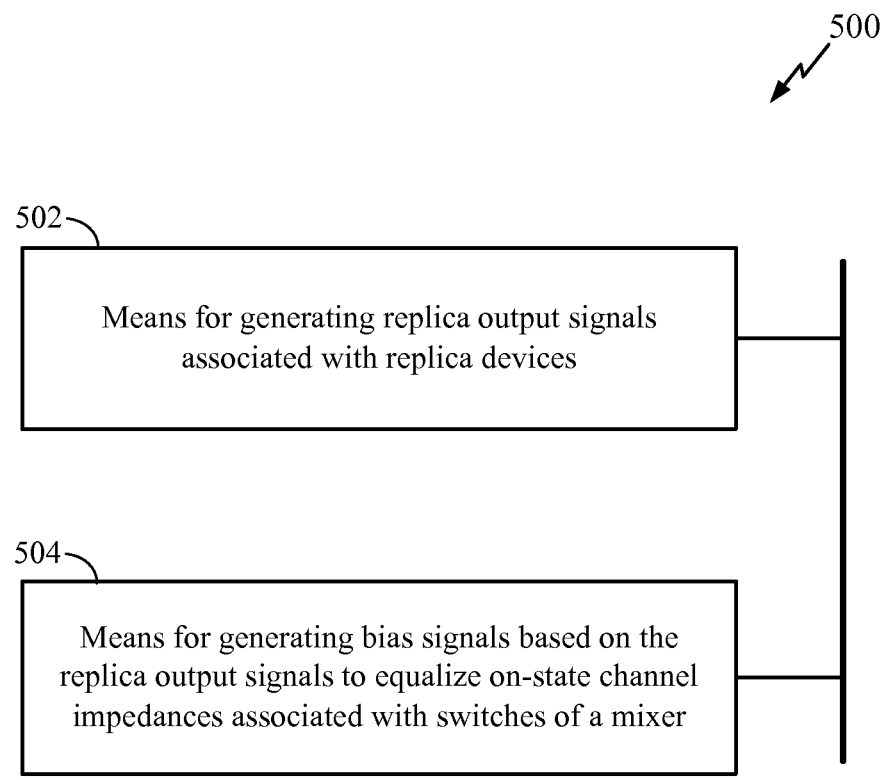
FIG. 5 shows an exemplary embodiment of a channel impedance equalizer apparatus that provides equalized channel impedances for a primary mixer.

FIG. 5 shows an exemplary embodiment of a channel impedance equalizer apparatus 500 that provides equalized channel impedances for a primary mixer. For example, the apparatus 500 is suitable for use as the channel impedance equalizer 304 shown in FIG. 3. In an aspect, the apparatus 500 is implemented by one or more modules configured to provide the functions as described herein. For example, in an aspect, each module comprises hardware and/or hardware executing software.

The apparatus 500 comprises a first module comprising means (502) for generating replica output signals associated with replica devices, which in an aspect comprises the replica switch devices 306.

The apparatus 500 comprises a second module comprising means (504) for generating bias signals based the replica output signals to equalize on-state channel impedances associated with switches of a mixer, which in an aspect comprises the error amplifier 310.

Those of skill in the art would understand that information and signals may be represented or processed using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. It is further noted that transistor types and technologies may be substituted, rearranged or otherwise modified to achieve the same results. For example, circuits shown utilizing PMOS transistors may be modified to use NMOS transistors and vice versa. Thus, the amplifiers disclosed herein may be realized using a variety of transistor types and technologies and are not limited to those transistor types and technologies illustrated in the Drawings. For example, transistors types such as BJT, GaAs, MOSFET or any other transistor technology may be used.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both non-transitory computer storage media and communication media including any medium that facilitates transfer of a computer program from one place to another. A non-transitory storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The description of the disclosed exemplary embodiments is provided to enable any person skilled in the art to make or use the invention. Various modifications to these exemplary embodiments will be readily apparent to those skilled in the art, and the generic principles defined herein may be applied to other embodiments without departing from the spirit or scope of the invention. Thus, the invention is not intended to be limited to the exemplary embodiments shown herein but is to be accorded the widest scope consistent with the principles and novel features disclosed herein.

What is claimed is:

1. An apparatus comprising:
   replica devices configured to generate replica output signals; and
   an error amplifier configured to generate bias signals based on the replica output signals to equalize on-state channel impedances associated with switches of a mixer.

2. The apparatus of claim 1, the replica devices and the switches of the mixer comprise switching devices having finite on-state channel impedance as a function of input voltage.

3. The apparatus of claim 2, the replica devices and the switches of the mixer comprise field effect transistor (FET) devices.

4. The apparatus of claim 3, the replica devices and the switches of the mixer comprise metal oxide semiconductor (MOS) transistor devices.

5. The apparatus of claim 1, the replica devices formed on an integrated circuit that includes the switches of the mixer.

6. The apparatus of claim 1, the bias signals are coupled to direct-current (DC) bias local oscillator (LO) signals that are coupled to the switches of the mixer.

7. The apparatus of claim 1, the replica output signals are based on averaged on-state channel impedances associated with the replica devices.

8. The apparatus of claim 1, further comprising a reference generator configured to inject current into the replica devices to generate the replica output signals based on averaged on-state channel impedances associated with the replica devices.

9. The apparatus of claim 8, the replica devices comprising replica n-type metal-oxide-semiconductor (NMOS) devices having drain terminals connected to a first current source of the reference generator and source terminals connected to a voltage reference, and the replica devices further comprising replica p-type metal-oxide-semiconductor (PMOS) devices having source terminals connected to a second current source of the reference generator and drain terminals connected to the voltage reference.

10. The apparatus of claim 9, the replica NMOS devices connected to first local oscillator (LO) signals that drive NMOS devices of the mixer, and the replica PMOS devices connected to second LO signals that drive PMOS devices of the mixer.

11. The apparatus of claim 10, the error amplifier comprising:
   a first comparator configured to compare a first reference signal to a first replica output signal associated with the replica NMOS devices to generate an NMOS bias signal; and
   a second comparator configured to compare a second reference signal to a second replica output signal associated with the replica PMOS devices to generate a PMOS bias signal.

12. The apparatus of claim 11, the NMOS bias signal configured to direct-current (DC) bias the first LO signals that drive the NMOS devices of the mixer, and the PMOS bias signal configured to DC bias the second LO signals that drive the PMOS devices of the mixer.

13. An apparatus comprising:
   means for generating replica output signals associated with replica devices; and
   means for generating bias signals based on the replica output signals to equalize on-state channel impedances associated with switches of a mixer.

14. The apparatus of claim 13, the means for generating replica output signals and the switches of the mixer comprising field effect transistor (FET) switching devices formed on an integrated circuit.

15. The apparatus of claim 13, further comprising means for generating reference signals that are configured to inject current into the means for generating replica output signals to generate the replica output signals based on averaged on-state channel impedances associated with the replica devices.

16. The apparatus of claim 15, the means for generating replica output signals comprising replica n-type metal-oxide-semiconductor (NMOS) devices having drain terminals connected to a first current source of the means for generating reference signals and source terminals connected to a voltage reference, and the means for generating replica output signals further comprising replica PMOS devices having source terminals connected to a second current source of the means for generating reference signals and drain terminals connected to the voltage reference.

17. The apparatus of claim 16, the replica NMOS devices connected to first local oscillator (LO) signals that drive NMOS devices of the mixer, and the replica PMOS devices connected to second LO signals that drive PMOS devices of the mixer.

18. The apparatus of claim 17, the means for generating bias signals comprising:
   means for comparing a first reference signal to a first replica output signal associated with the replica NMOS devices to generate an NMOS bias signal; and
   means for comparing a second reference signal to a second replica output signal associated with the replica PMOS devices to generate a PMOS bias signal.

19. The apparatus of claim 18, the NMOS bias signal configured to direct-current (DC) bias the first LO signals that drive the NMOS devices of the mixer, and the PMOS bias signal configured to DC bias the second LO signals that drive the PMOS devices of the mixer.

20. A method comprising:
   generating output signals at a plurality of replica devices, the plurality of replica devices including at least one n-type metal oxide semiconductor (NMOS) device and at least one p-type metal oxide semiconductor (PMOS) device;
   generating adjustment signals at an error amplifier based on the output signals to adjust on-state channel impedances associated with switches of a mixer; and
   receiving, at the mixer, the adjustment signals and an oscillation signal generated using a local oscillator (LO) device.

21. The method of claim 20, wherein the mixer includes an NMOS device corresponding to the at least one NMOS device, and wherein the mixer further includes a PMOS device corresponding to the at least one PMOS device.

22. The method of claim 21, wherein the NMOS device of the mixer and the PMOS device of the mixer are connected in parallel.

* * * * *